(12) United States Patent
Yoon et al.

(10) Patent No.: US 9,576,965 B2
(45) Date of Patent: Feb. 21, 2017

(54) SEMICONDUCTOR DEVICE AND METHOD FOR FABRICATING THE SAME

(71) Applicant: SK hynix Inc., Icheon (KR)

(72) Inventors: Jae Man Yoon, Seoul (KR); Young Bog Kim, Yongin (KR); Yun Seok Chun, Seongnam (KR); Woong Choi, Seoul (KR); Woo Jun Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/754,589

(22) Filed: Jun. 29, 2015

(65) Prior Publication Data

US 2015/0380415 A1  Dec. 31, 2015

Related U.S. Application Data

(63) Continuation of application No. 14/229,612, filed on Mar. 28, 2014, now abandoned.

(30) Foreign Application Priority Data

Oct. 28, 2013  (KR) .......................... 10-2013-0128665

(51) Int. Cl.
| | |
|---|---|
| *H01L 27/108* | (2006.01) |
| *H01L 27/02* | (2006.01) |
| *H01L 21/02* | (2006.01) |
| *H01L 21/285* | (2006.01) |
| *H01L 21/311* | (2006.01) |
| *H01L 21/768* | (2006.01) |

(52) U.S. Cl.
CPC ... *H01L 27/10885* (2013.01); *H01L 21/02282* (2013.01); *H01L 21/28525* (2013.01); *H01L 21/31144* (2013.01); *H01L 21/768* (2013.01); *H01L 27/0207* (2013.01); *H01L 27/1085* (2013.01); *H01L 27/10814* (2013.01); *H01L 27/10823* (2013.01); *H01L 27/10855* (2013.01); *H01L 27/10894* (2013.01)

(58) Field of Classification Search
CPC ................... H01L 27/10855; H01L 27/10885; H01L 2924/0002; H01L 27/10876; H01L 27/10894

See application file for complete search history.

(56) References Cited

U.S. PATENT DOCUMENTS

| | | | |
|---|---|---|---|
| 6,734,481 B2 | 5/2004 | Takeuchi | |
| 2012/0052648 A1* | 3/2012 | Kwon et al. | .................. 438/381 |

FOREIGN PATENT DOCUMENTS

| | | |
|---|---|---|
| KR | 10-2001-0057490 A | 7/2001 |
| KR | 10-2012-0005272 A | 1/2012 |
| KR | 10-2012-0042576 A | 5/2012 |

* cited by examiner

*Primary Examiner* — Tony Tran

(57) ABSTRACT

A semiconductor device includes a bit line disposed over a semiconductor substrate, a supporting film being perpendicular to the bit line, a first storage node contact disposed at a lower part of a region disposed between the bit line and the supporting film, and a second storage node contact having a line shape, disposed over the first storage node contact and the bit line, isolated by the supporting film, and patterned in a diagonal direction across the bit line.

9 Claims, 17 Drawing Sheets

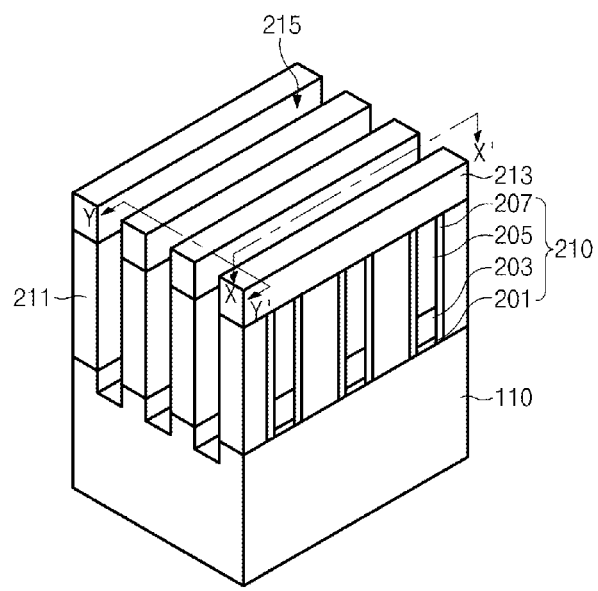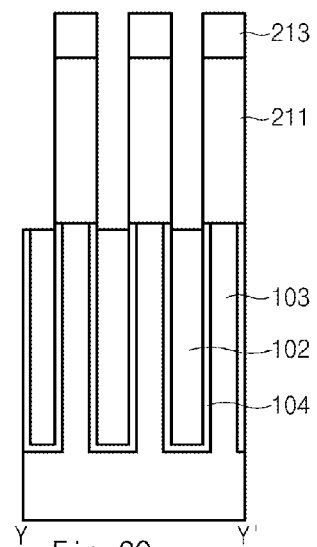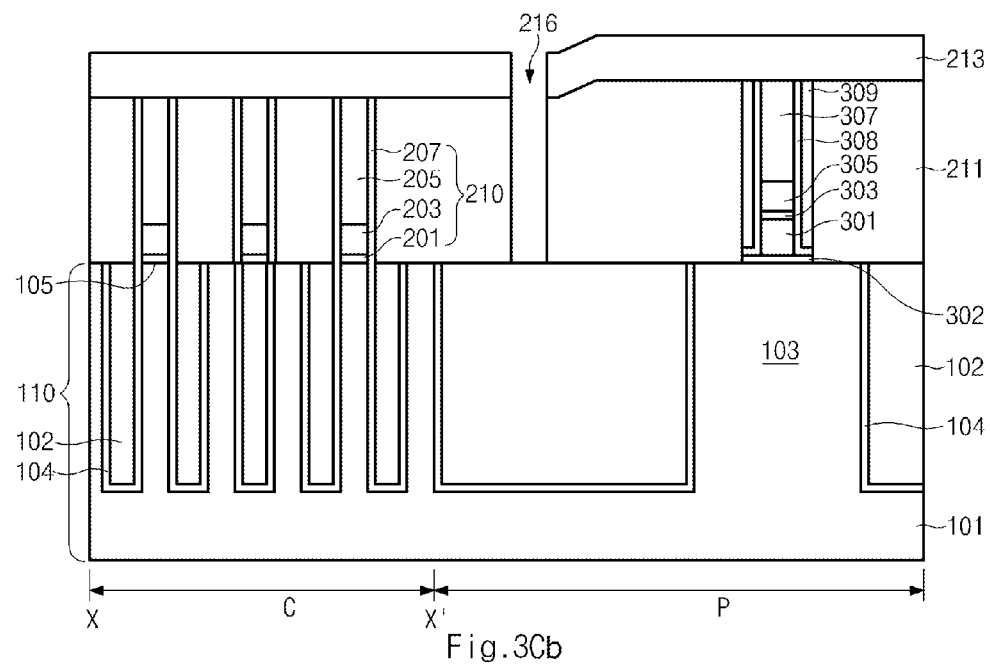

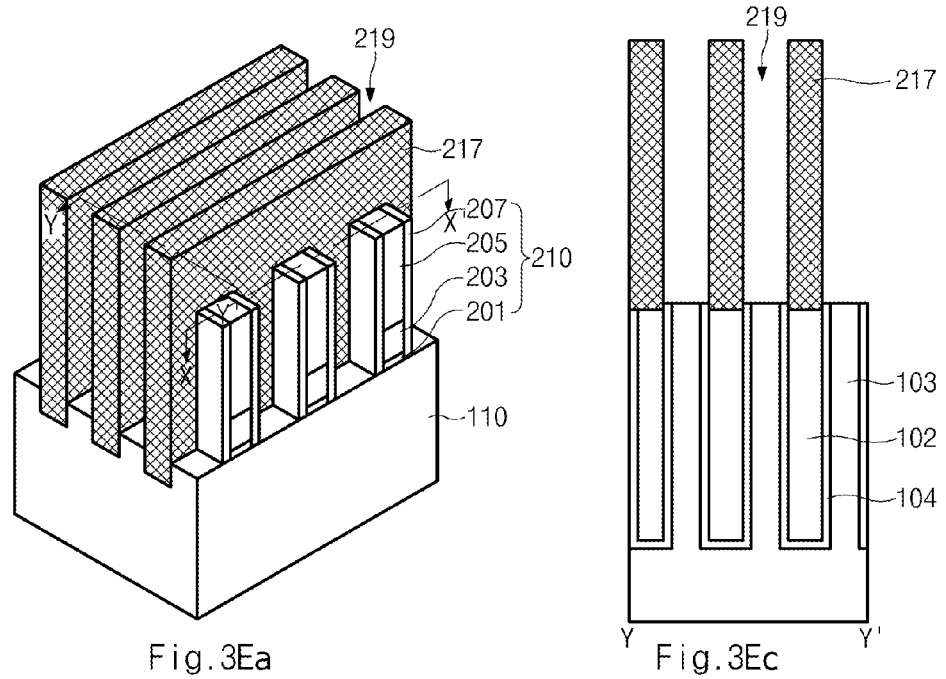
Fig.3Ea
Fig.3Ec
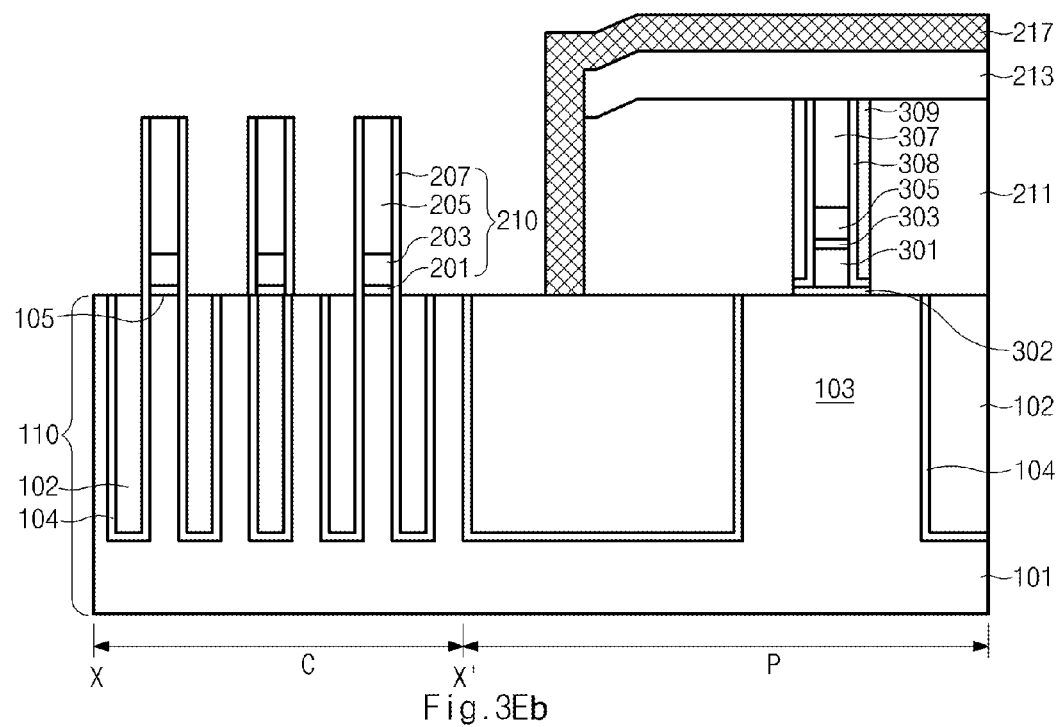
Fig.3Eb

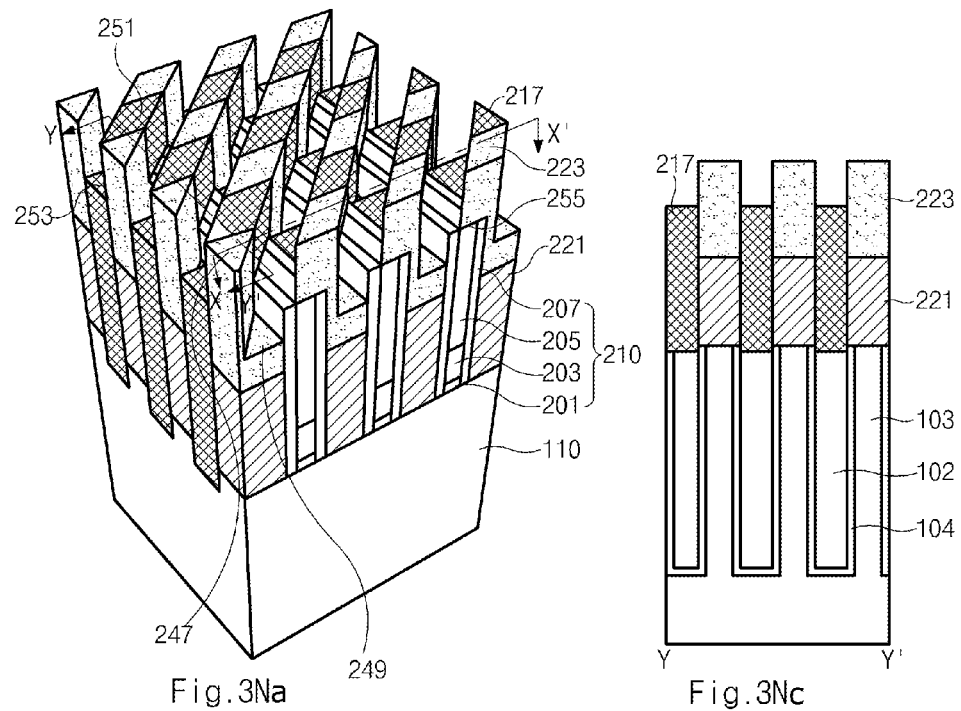
Fig.3Na
Fig.3Nc
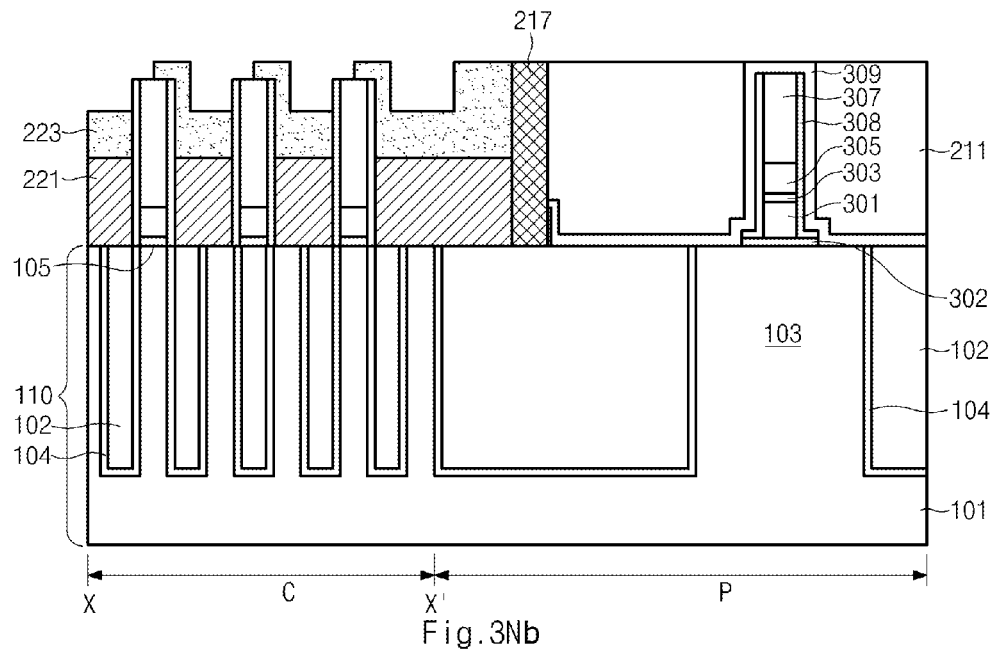
Fig.3Nb

SEMICONDUCTOR DEVICE AND METHOD FOR FABRICATING THE SAME

CROSS-REFERENCE TO RELATED APPLICATION

This application is a continuation of U.S. patent application Ser. No. 14/229,612 filed on Mar. 28, 2014. which claims the priority of Korean patent application No. 10-2013-0128665 filed on 28 Oct. 2013, the disclosures of which are hereby incorporated by reference in their entireties.

BACKGROUND

The present invention relates to a semiconductor device and a method for fabricating the same, and more particularly to a technology for forming a storage node contact.

A semiconductor is a material having electrical characteristics between that of a conductor and a nonconductor. A semiconductor is used to form a semiconductor device such as a transistor through impurity implantation and conductor connection.

As the degree of integration of the semiconductor device increases, the size of the semiconductor device is gradually reduced and thus the size of a semiconductor chip including a plurality of semiconductor devices is also gradually reduced.

As the size of a semiconductor device is gradually reduced, a contact margin between a storage node and a storage node contact disposed below the storage node is also reduced.

SUMMARY

Embodiments of the present invention are directed to a semiconductor device and a method for fabricating the same, which substantially obviate one or more problems due to limitations and disadvantages of the related art.

Embodiments of the present invention relate to a semiconductor device and a method for fabricating the same, which simplify a process for forming storage node contact. Embodiments of the present invention relate to a semiconductor device and a method for fabricating the same, which facilitate self-alignment of the storage node contact.

In accordance with an aspect of the embodiment, a semiconductor device includes: a bit line formed over a semiconductor substrate; a supporting film perpendicular to the bit line and partially covering a top surface of the bit line; a first storage node contact formed at a lower part of a region disposed between the bit line and the supporting film; and a second storage node contact formed in a line shape over the first storage node contact and the bit line, isolated by the supporting film, and patterned to extend diagonally across the bit line.

In accordance with another aspect of the embodiment, a semiconductor device includes: first and second bit lines spaced apart from each other by a first distance over a semiconductor substrate; first and second supporting films perpendicular to the first and second bit lines, spaced apart from each other by a second distance, and formed in a line shape to partially cover the first and second bit lines; and first and second storage node contacts that are self-aligned and deposited between the first and second supporting films.

In accordance with another aspect of the embodiment, a method for forming a semiconductor device includes: forming first and second bit lines spaced apart from each other by a first distance over a semiconductor substrate; forming first and second supporting films spaced apart from each other by a second distance in a direction perpendicular to the first and second bit lines, wherein top surfaces of the first and second supporting films are located at higher levels than top surfaces of the first and second bit lines; forming a first storage node contact and a second storage node contact between the first supporting film and the second supporting film; and patterning upper portions of the second storage node contact and the first and second supporting films in a diagonal direction across the bit line.

The forming the first and second supporting films includes: forming an interlayer insulation film to fill a space between the first bit line and the second bit line; forming a capping film over the first and second bit lines and the interlayer insulation film; forming first and second holes spaced apart from each other by the second distance in a direction perpendicular to the first and second bit lines; forming the first supporting film and the second supporting film by filling the first hole and the second hole with an insulation material; and removing the interlayer insulation film and the capping film.

In the forming of the first and second supporting film, the first hole and the second hole are formed in a cell region using a cell-opening mask.

The forming the first and second storage node contacts includes: forming the first storage node contact at a lower part of a region surrounded by the first and second supporting films and the first and second bit lines; and forming the second storage node contact over the first storage node contact and the first and second bit lines.

A top surface of the second storage node contact is located at substantially the same level as the top surfaces of the first and second supporting films or located below the top surfaces of the first and second supporting films.

The first storage node contact is formed of a polysilicon material, and the second storage node contact is formed of a metal material.

The patterning includes: patterning the second storage node using a Spacer Patterning Technology (SPT) or a Double Patterning Technology (DPT).

The patterning includes: sequentially depositing a first interlayer insulation film, a first etch stop film, a second interlayer insulation film, and a second etch stop film over the second storage node contact; forming first patterns by etching the second etch stop film and the second interlayer insulation film; depositing a spacer material along a step difference of the first patterns; depositing a Spin On Carbon (SOC) material in a space disposed between the first patterns on which the spacer material is deposited; forming second patterns by etching the spacer material and the first etch stop film; forming third patterns by etching the first interlayer insulation film using the second patterns as a mask; and patterning the upper portion of the second storage node contact using the third patterns as a mask.

A distance between the first patterns is at least two times greater than a distance between the second patterns.

It is to be understood that both the foregoing general description and the following detailed description of embodiments are intended to provide further explanation of the invention as claimed.

Figure 1A:
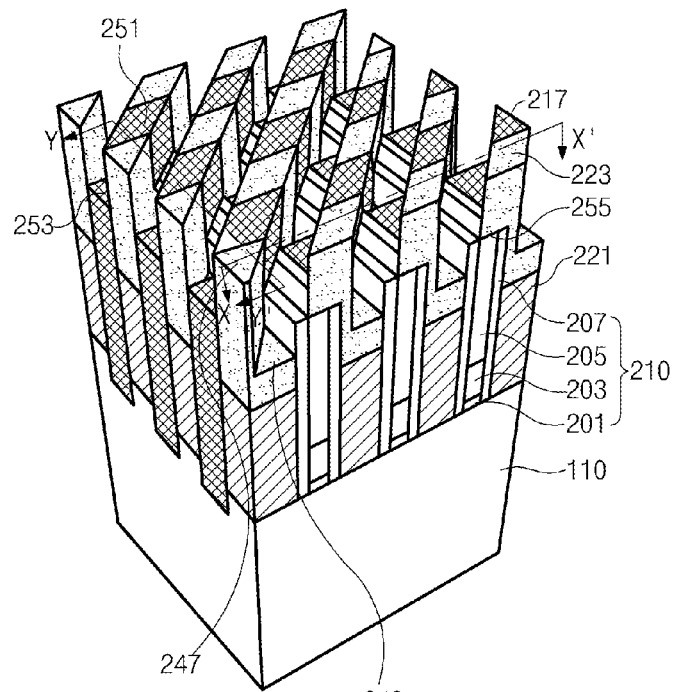
FIG. 1A shows a perspective view of a semiconductor device according to an embodiment.

1C are cross-sectional views of a semiconductor device according to an embodiment taken along line X-X' and Y-Y' of FIG. 1A, respectively.

Figure 2:
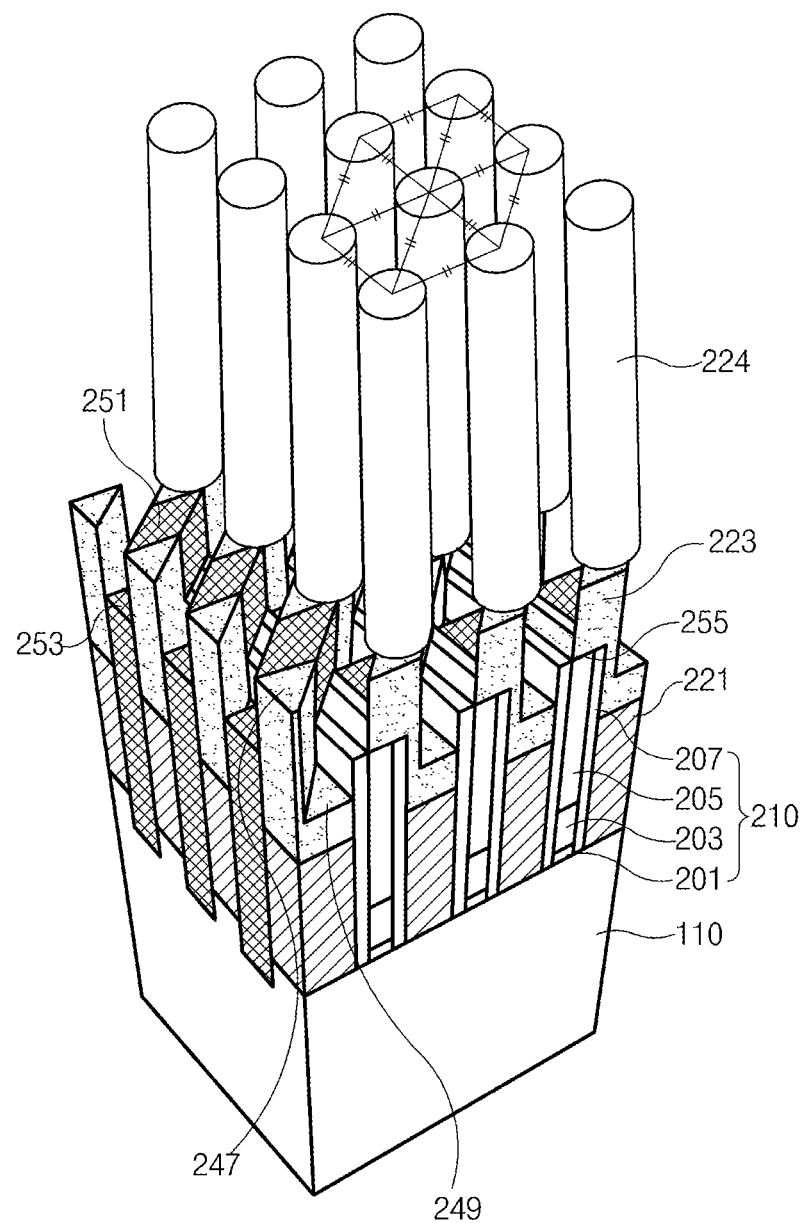

FIG. 2 is a perspective view illustrating a storage node according to an embodiment.

Figure 3A:
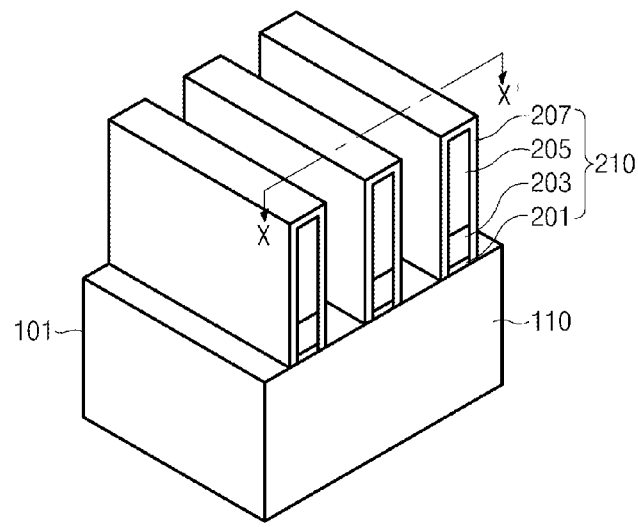
Figure 3A:
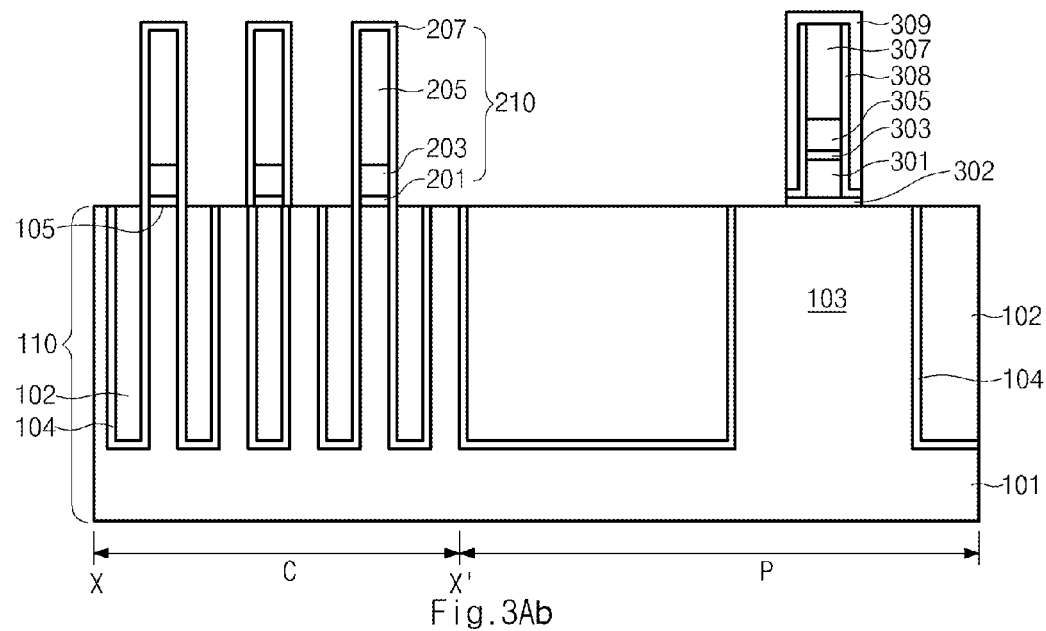

FIGS. 3Aa to 3Nc are views illustrating a method for forming a semiconductor device according to an embodiment; each of FIGS. 3Aa, 3Ba, 3Ca, 3Da, 3Ea, 3Fa, and 3Na shows a perspective view of the semiconductor device; each of FIGS. 3Ab, 3Bb, 3Cb, 3Db, 3Eb, 3Fb, and 3Nb shows a cross-sectional view taken along line X-X' of each of FIGS. 3Aa, 3Ba, 3Ca, 3Da, 3Ea, 3Fa, and 3Na; and each of FIGS. 3Ac, 3Bc, 3Cc, 3Dc, 3Ec, 3Fc, and 3Nc shows a cross-sectional view taken along line Y-Y' of each of FIGS. 3Aa, 3Ba, 3Ca, 3Ea, 3Da, 3Fa, and 3Na.

Figure 4:
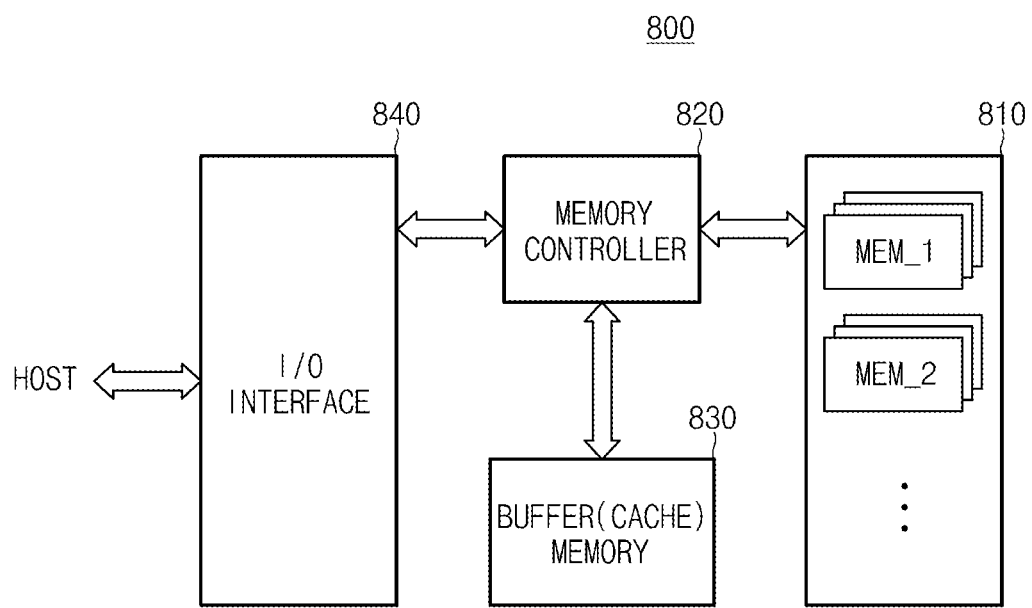

FIG. 4 is a block diagram illustrating a memory system including a semiconductor device according to an embodiment.

DESCRIPTION OF EMBODIMENTS

Reference will now be made in detail to embodiments of the present invention, examples of which are illustrated in the accompanying drawings. Wherever possible, the same reference numbers are used throughout the drawings to refer to the same or like portions. In the following description, a detailed description of related known configurations or functions incorporated herein may be omitted for clarity of the subject matter of the present disclosure.

An embodiment relates to a storage node contact in which storage nodes may be arranged, for example, in a zigzag pattern or other pattern to increase a cell capacity. When forming a storage node to be directly aligned with a storage node contact, a process margin between the storage node and the storage node contact may be deteriorated. To improve the process margin, the storage node contact is formed through two processing steps.

However, in order to form the storage node contact through two processing steps, a mask process for forming a second storage node contact should be performed after a first storage node contact is formed.

An embodiment is directed to a method for forming a semiconductor device including a storage node contact. In a method in accordance with an embodiment, when forming the storage node contact through two processing steps, a second storage node contact is formed using a supporting film without using an additional mask after a first storage node contact is formed. As a result, a fabrication method can be simplified, and self-alignment of the storage node contact can be facilitated using the supporting film.

Figure 1C:
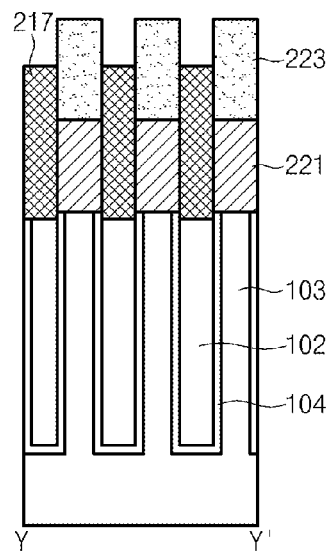
FIG. 1B and FIG.
Figure 1B:
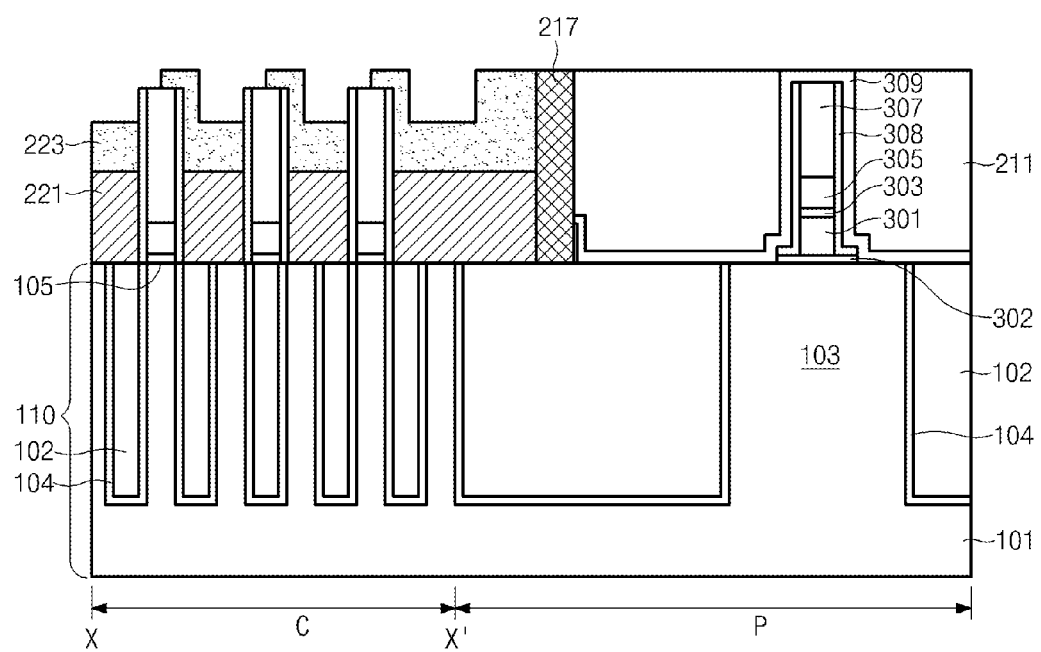

FIG. 1A-1C shows a perspective view and cross-sectional views illustrating a semiconductor device according to an embodiment.

In FIGS. 1A-1C, FIG. 1A illustrates a perspective view of the semiconductor device, FIG. 1B illustrates a cross-sectional view of the semiconductor device taken along a line X-X' in FIG. 1A, and FIG. 1C illustrates a cross-sectional view of the semiconductor device taken along a line Y-Y' in FIG. 1A.

Referring to FIG. 1A, the semiconductor device includes a bit line 210 arranged in a first direction on a semiconductor substrate 101, a gate (not shown) buried along a direction perpendicular to the bit line 210, a supporting film 217 formed over the semiconductor substrate 101 along a direction perpendicular to the bit line 210, and a storage node contact including a first storage node contact 221 and a second storage node contact 223 that are deposited between the bit line 210 and the supporting film 217 located adjacent to the bit line 210. The bit line 210 includes a polysilicon layer 201, a bit-line metal layer 203, a bit-line hard mask layer 205, and a spacer 207 formed at sidewalls of the layers 201, 203, and 205.

The first storage node contact 221 is formed at a lower part of a region disposed between the supporting film 217 and the bit line 210. The second storage node contact 223 is formed over the first storage node contact 221. The second storage node contact 223 crosses the bit line 210 diagonally and has a first top surface 247 and a second top surface 249 that have a step difference therebetween. In an embodiment, the first top surface 247 is located above a top surface 255 of the bit line 210, and the second top surface 249 is located below the top surface 255 of the bit line 210.

The supporting film 217 insulates the first storage node contacts 221 from each other or the second storage node contacts 223 from each other or both. Upper portions of the supporting film 217 and the second storage node contact 223 are etched to form line patterns that extend diagonally across the bit line 210. The line patterns include line-shaped trenches, i.e., elongated trenches extending lengthwise along a line, separated by line-shaped pillars comprised of alternating upper portions of the supporting film 217 and the second storage node contacts 223. These line patterns are provided over the bit lines 210 to cross the bit lines 210 diagonally.

Thus, the supporting film 217 also has a first top surface 251 and a second top surface 253 with a step difference therebetween. The first top surface 251 is formed over the top surface 255 of the bit line 210. The second top surface 253 may be formed at the same level as the top surface 255 of the bit line 210, or may be formed below the top surface 255 of the bit line 210. The second top surface 253 of the supporting film 217 may be located at a higher level than a top surface of the first storage node contact 221.

In another embodiment, the top surface 247 of the second storage node contact 223 is located at substantially the same level as the top surface 251 of the supporting film 217 or located below the top surface 251 of the supporting film 217.

A detailed configuration of a lower structure 110 is shown in the cross-sectional views FIG. 1B and FIG. 1C. The lower structure 110 includes an active region 103 defined by a device isolation film 102 formed in the semiconductor substrate 101, and a bit line contact 105 coupled to the bit line 210. Thus, the bit line 210 is formed over the bit line contact 105. An oxide film 104 is formed along a border between the device isolation film 102 and the active region 103. Although not shown in the cross-sectional views FIG. 1B and FIG. 1C, a buried gate is formed in the semiconductor substrate 101, and the buried gate is formed to be perpendicular to the bit line 210.

In FIG. 1B, 'C' indicates a cell region, and 'P' indicates a peripheral region of the semiconductor device. A structure formed in the peripheral region P in accordance with an embodiment will be described later with reference to FIGS. 3Aa to 3Nc.

FIG. 2 is a perspective view illustrating a storage node 224 formed according to an embodiment. Referring to FIG. 2, the storage node 224 is formed over a second storage node contact 223. As described above with reference to FIG. 1A, the second storage node contact 223 is patterned in a diagonal direction so that a step difference is formed between a first top surface and a second top surface thereof, resulting in improvement of the contact margin between the storage node 224 and the second storage node contact 223.

In an embodiment, six storage nodes 224 are arranged within substantially the same distance from one storage node as shown in FIG. 2, and two adjacent storage nodes are spaced from each other by substantially the same distance.

Since the storage node contact is formed through two processing steps, a contact margin between the storage node contact and the storage node 224 is improved. In addition, since the storage node contact, i.e., the first storage node contact 221 and the second storage node contact 223, is formed through the two processing steps using the supporting film 217 without using an additional mask, a fabrication process for forming the storage node contact can be simplified, and self-alignment is facilitated.

A method for forming the semiconductor device of FIGS. 1A-1C according to an embodiment will hereinafter be described with reference to FIGS. 3Aa to 3Nc. In FIGS. 3Aa-3Ab, FIG. 3Aa is a perspective view of the semiconductor device, FIG. 3Ab is a cross-sectional view of the semiconductor device taken along a line X-X' in FIG. 3Aa.

In an embodiment, a lower structure 110 disposed under a bit line 210 shown in FIG. 3Aa includes an active region 103 and a device isolation film 102 as shown in FIG. 3Ab. In addition, the lower structure 110 includes a buried gate (not shown) formed to cross the active region 103 and a bit line contact 105 coupled to the bit line 210. Since the lower structure 110 is shown and described with reference to FIG. 3Ab, a detailed description thereof will not be repeated in subsequent descriptions of structures of FIG. 3 for illustrative convenience. Instead, subsequent descriptions of FIG. 3 will be directed primarily to an upper structure, which is provided over the lower structure 110.

As can be seen from FIG. 3Aa, bit lines 210 spaced apart from each other by a predetermined distance are formed over the semiconductor substrate 101 in which the lower structure 110 of a cell region C is formed. In an embodiment, a barrier metal layer 201, a bit line metal layer 203, and a bit line hard mask layer 205 are sequentially deposited over the semiconductor substrate 101, and then they are patterned using a mask (not shown). After that, a spacer 207 is formed on a sidewall and a top surface of the patterned structure. The bit line 210 may be formed to be perpendicular to the buried gate (not shown).

In an embodiment, when the barrier metal layer 201, the bit line metal layer 203, and the bit line hard mask layer 205 are sequentially deposited over the bit line contact 105 of the cell region C, a polysilicon layer 301, a barrier metal layer 303, a gate conductive layer 305, and a hard mask layer 307 are sequentially deposited over the active region 103 of a peripheral region (also called a peri region) P. After the layers 301, 303, 305, and 307 are patterned, a spacer 308 is formed on a sidewall of the patterned structure, and an oxide film 309 is deposited on a sidewall and a top surface of a resultant structure including the spacer 308. The gate conductive layer 305 may be formed of a conductive material such as tungsten (W) or the like, and the hard mask layer 307 may be formed of a nitride film. Here, a gate insulation film 302 may be formed below the polysilicon layer 301.

Figure 3B:
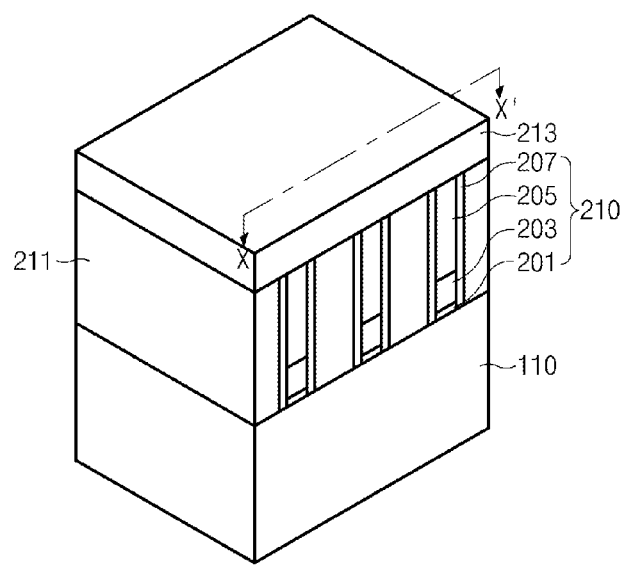
Figure 3B:
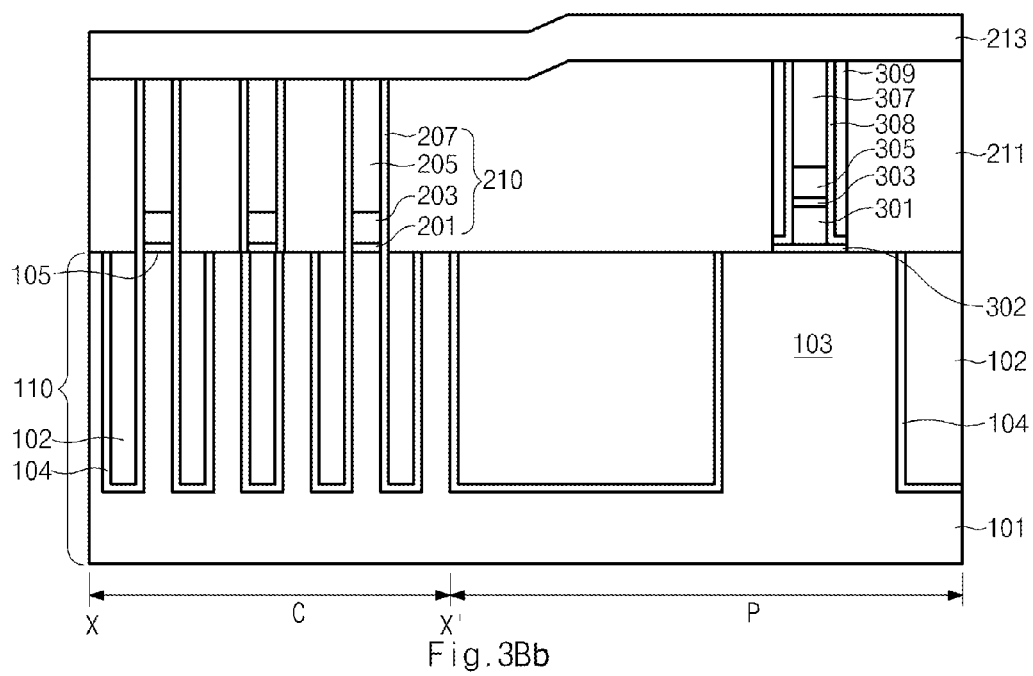

In FIGS. 3Ba-3Bb, FIG. 3Ba is a perspective view of the semiconductor device, and FIG. 3Bb is a cross-sectional view of the semiconductor device taken along a line X-X' in FIG. 3Ba. Referring to FIG. 3Ba-3Bb, an interlayer insulation film 211 is deposited to fill a space between the bit lines 210 and planarized until the bit line hard mask layer 205 in the cell region C and the hard mask layer 307 in the peripheral region P are exposed, and then a capping film 213 is deposited over the bit lines 210 and the interlayer insulation film 211. The capping film 213 may be formed of a nitride film.

In FIGS. 3Ca-3Cc, FIG. 3Ca is a perspective view of the semiconductor device, FIG. 3Cb is a cross-sectional view of the semiconductor device taken along a line X-X' in FIG. 3Ca, and FIG. 3Cc is a cross-sectional view of the semiconductor device taken along a line Y-Y' in FIG. 3Ca. Referring to FIG. 3Ca, FIG. 3Cb, and FIG. 3Cc, the interlayer insulation film 211 and the capping film 213 are etched so that line-shaped holes 215 and 216 are formed to be perpendicular to the bit line 210.

Figure 3D:
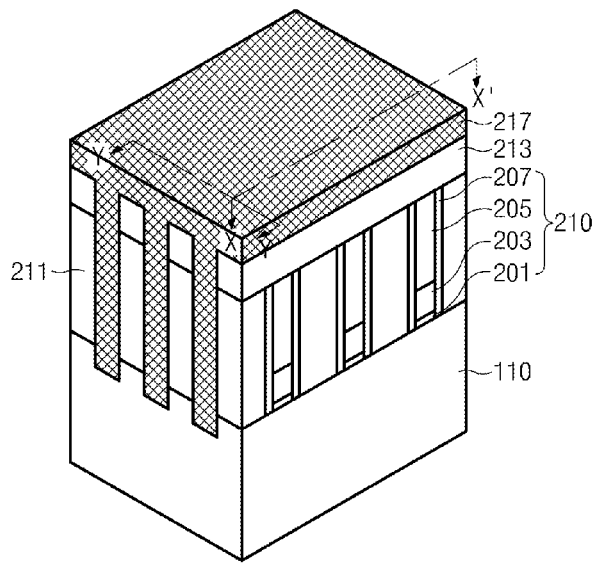
Figure 3D:
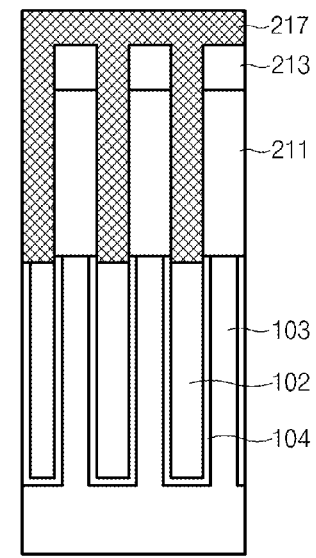
Figure 3D:
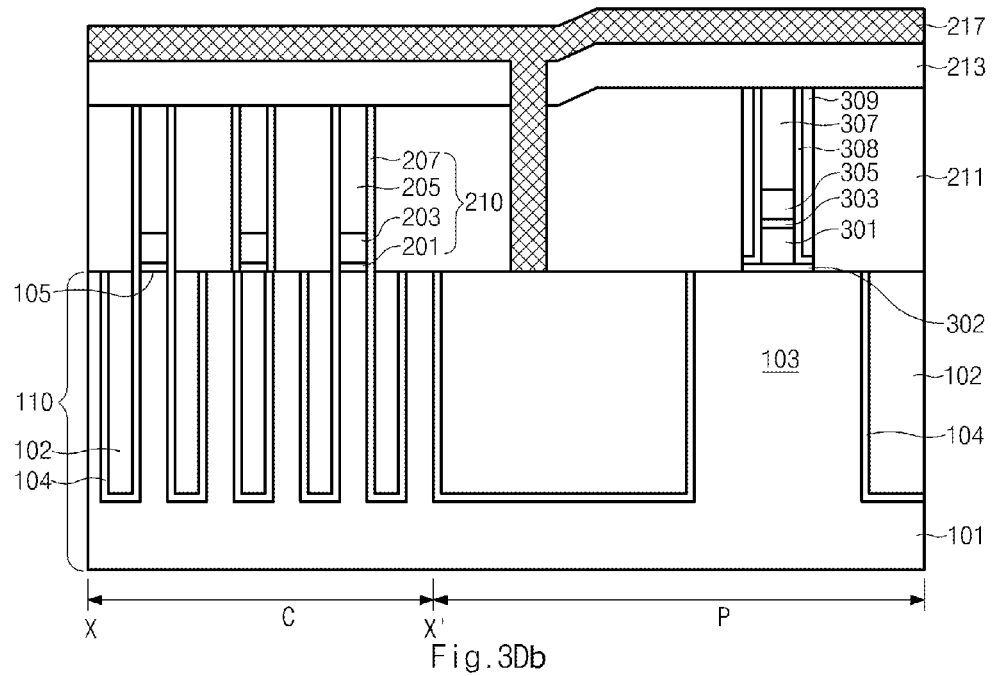

In FIGS. 3Da-3Dc, FIG. 3Da is a perspective view of the semiconductor device, FIG. 3Db is a cross-sectional view of the semiconductor device taken along a line X-X' in FIG. 3Da, and FIG. 3Dc is a cross-sectional view of the semiconductor device taken along a line Y-Y' in FIG. 3Da. Referring to FIGS. 3Da-3Dc, a nitride material is buried in the line-shaped holes 215 and 216 so that a supporting film 217 is formed.

In addition, the nitride material is deposited to cover the capping film 213. The supporting films 217 buried in the holes 215 and 216 are spaced apart from one another by a predetermined distance in a direction perpendicular to the bit line 210, resulting in formation of the line-shaped supporting films 217. The supporting films 217 may cover the top surfaces of the bit lines 210 partially.

In FIGS. 3Ea-3Ec, FIG. 3Ea is a perspective view of the semiconductor device, FIG. 3Eb is a cross-sectional view of the semiconductor device taken along a line X-X' in FIG. 3Ea, and FIG. 3Ec is a cross-sectional view of the semiconductor device taken along a line Y-Y' in FIG. 3Ea. Referring to FIGS. 3Ea-3Ec, a cell opening mask (not shown) is formed, and then the interlayer insulation film 211 and the capping film 213 disposed between the supporting films 217 are removed using the supporting films 217 in the cell region C as an etch mask. As a result, line-shaped holes 219 are formed between the supporting films 217, and a top surface of the supporting film 217 is located at a higher level than a top surface of the bit line 210. In other words, a step difference between the top surface of the supporting film 217 and the top surface of the bit line 210 is formed.

Figure 3F:
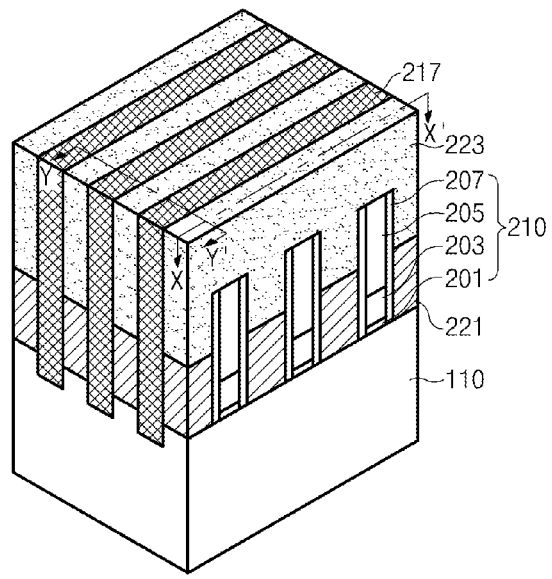
Figure 3F:
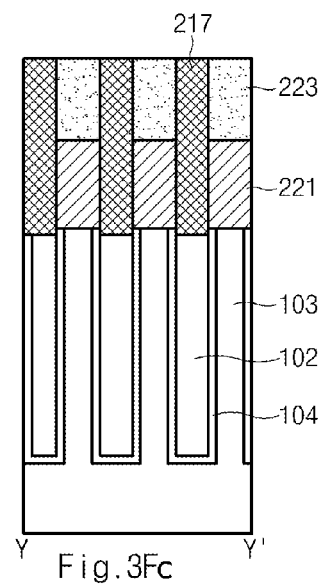
Figure 3F:
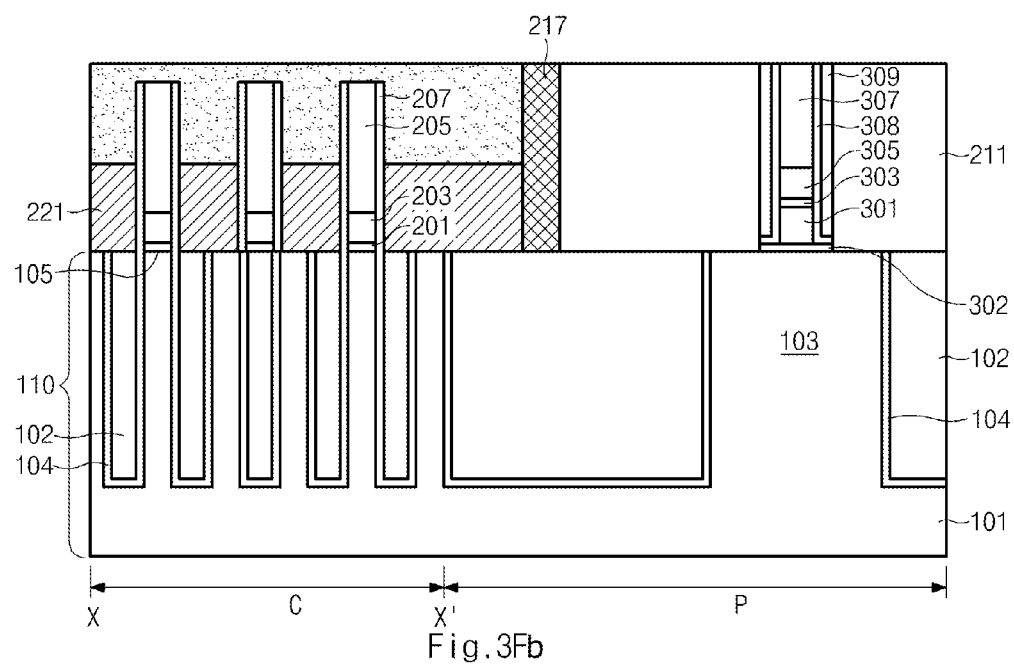

In FIGS. 3Fa-3Fc, FIG. 3Fa is a perspective view of the semiconductor device, FIG. 3Fb is a cross-sectional view of the semiconductor device taken along a line X-X' of FIG. 3Fa, and FIG. 3Fc is a cross-sectional view of the semiconductor device taken along a line Y-Y' in FIG. 3Fa. Referring to FIGS. 3Fa-3Fc, a first storage node contact 221 is formed at a lower part of the hole 219, and a second storage node contact 223 is formed over the first storage node contact 221. In an embodiment, the first storage node contact 221 is formed as island type contacts separated from each other and provided between the bit lines 210 and the supporting film 217. In an embodiment, the first storage node contact 221 may be formed of a polysilicon material or the like. The second storage node contact 223 is formed in the holes 219 between the bit lines 210 and over the bit lines 210. The second storage node contact 223 is formed as a line type, and may be formed of a metal material or the like.

Although not shown in the drawings, an air spacer, i.e., an unfilled gap or space, may be formed between the first storage node contact 223 and the bit line 210. In addition, a cobalt silicide (CoSix) material may be deposited between the first storage node contact 221 and the second storage node contact 223.

FIGS. 3G to 3M are cross-sectional views illustrating a method for patterning the second storage node contact 223 in a diagonal direction using a Spacer Patterning Technology (SPT) and a Double Patterning Technology (DPT). In more detail, FIGS. 3G to 3M are cross-sectional views illustrating the semiconductor device taken along the line X-X' in the cell region C.

Figure 3G:
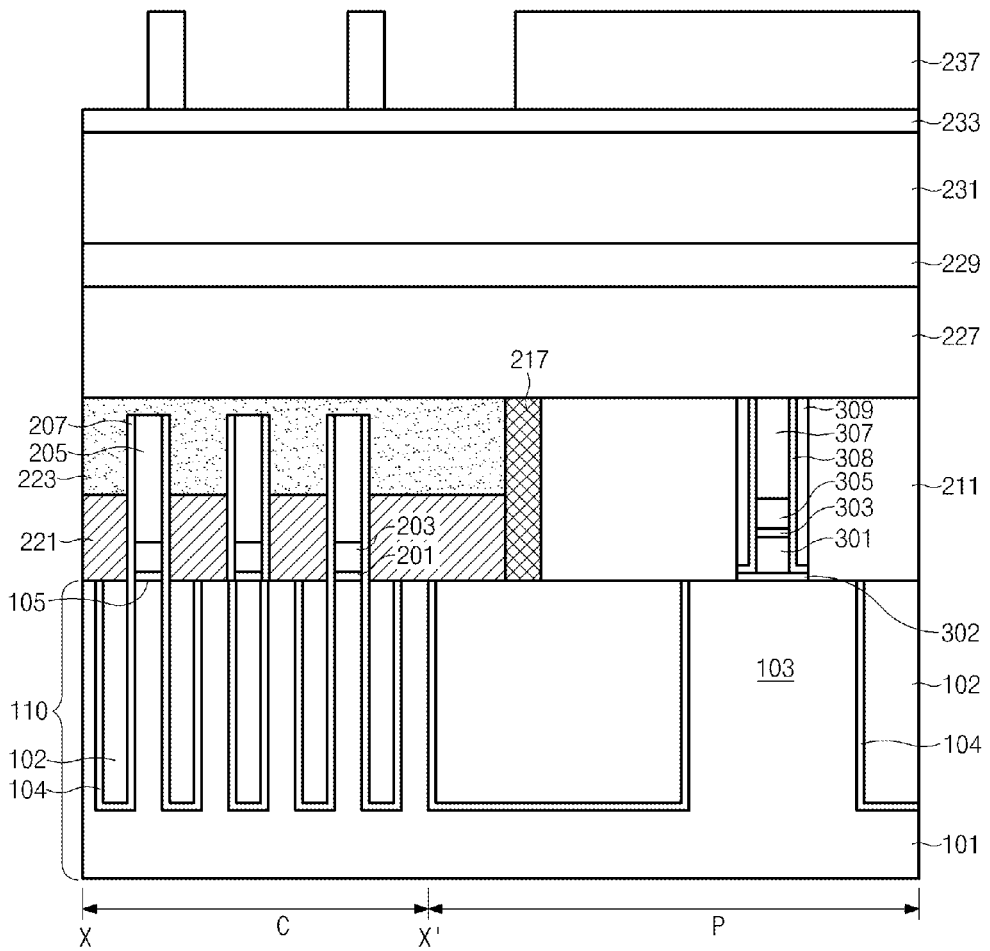

Referring to FIG. 3G, a first interlayer insulation film 227, a first etch stop film 229, a second interlayer insulation film 231, and a second etch stop film 233 are sequentially deposited over a resultant structure where the second storage node contact 223 is formed. After that, a photoresist pattern 237 is formed over the second etch stop film 233. In an embodiment, the first or second etch stop film 229 or 233 may be formed of a silicon oxynitride (SiON) film or the like.

Figure 3H:
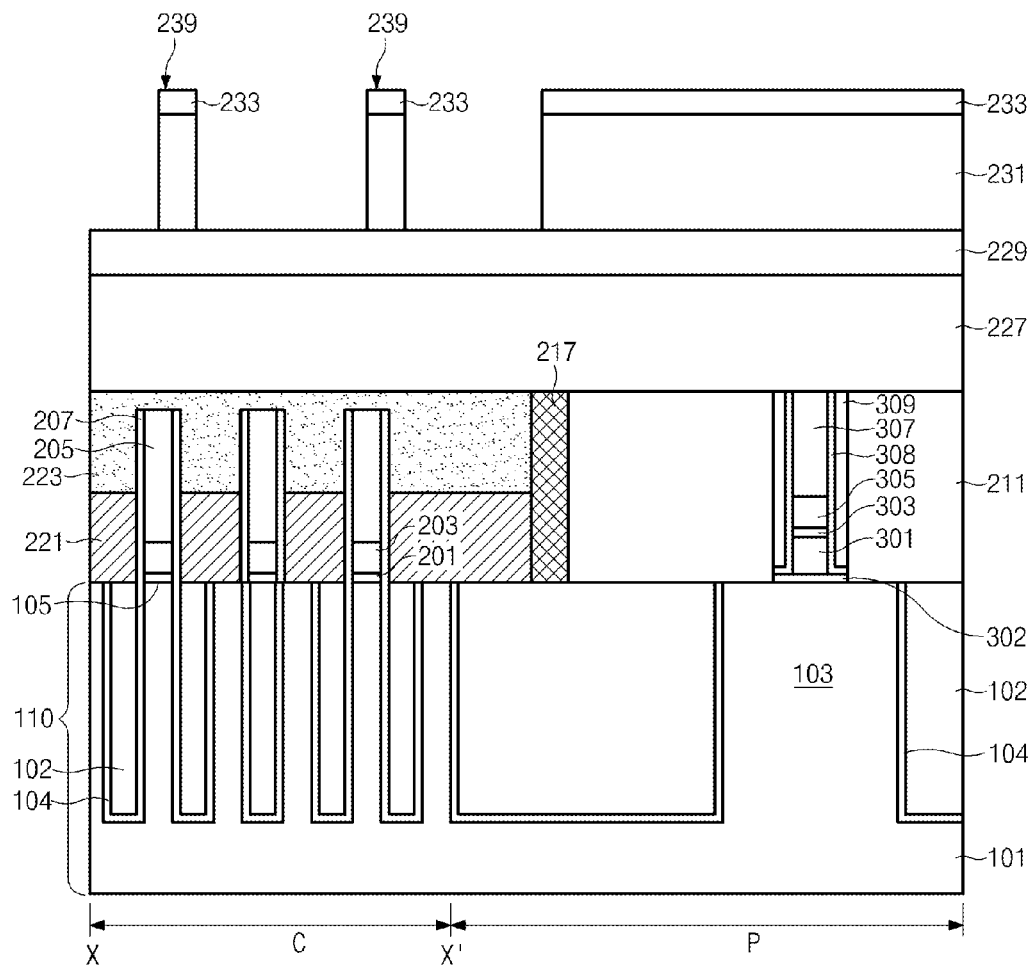

Referring to FIG. 3H, the second etch stop film 233 and the second interlayer insulation film 231 in the cell region C are etched using the photoresist pattern 237 as a mask until the first etch stop film 229 is exposed. As a result, first patterns 239 spaced apart from each other by a predetermined distance are formed over the first etch stop film 229 in the cell region C. During this process, only the cell region C is opened.

Figure 3I:
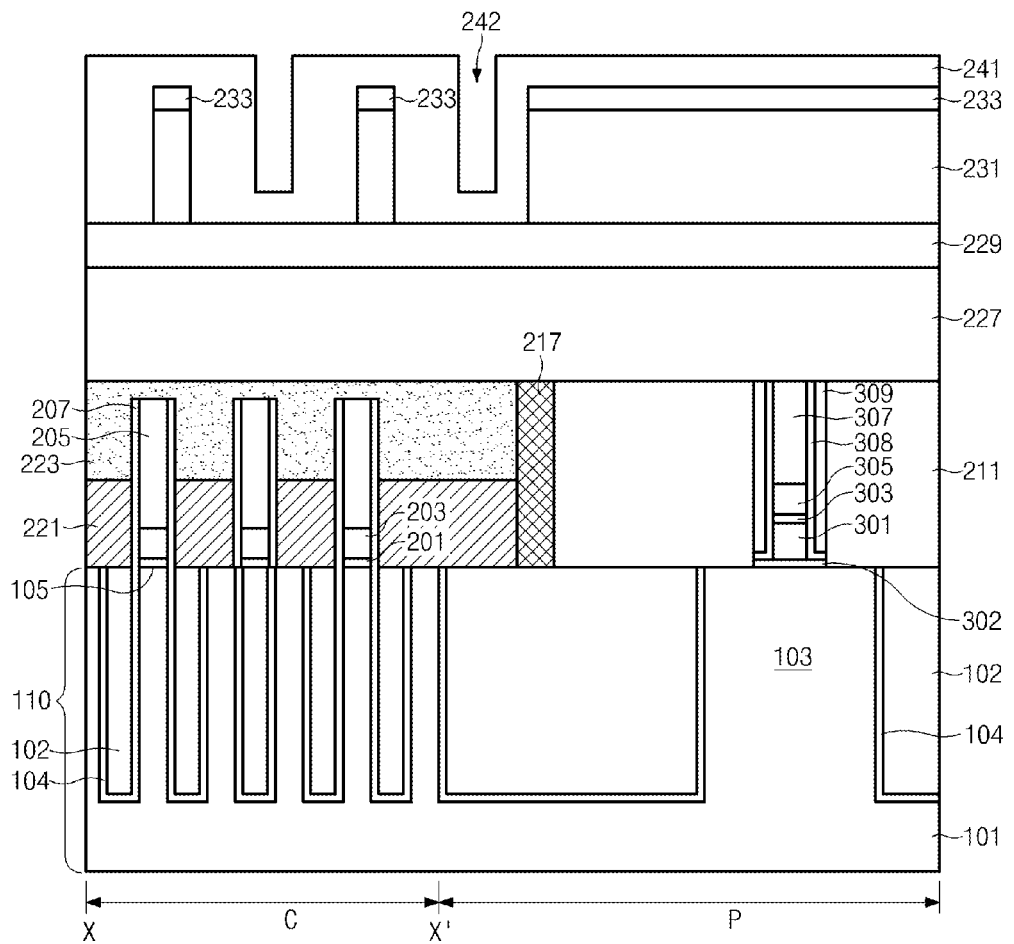
Figure 3J:
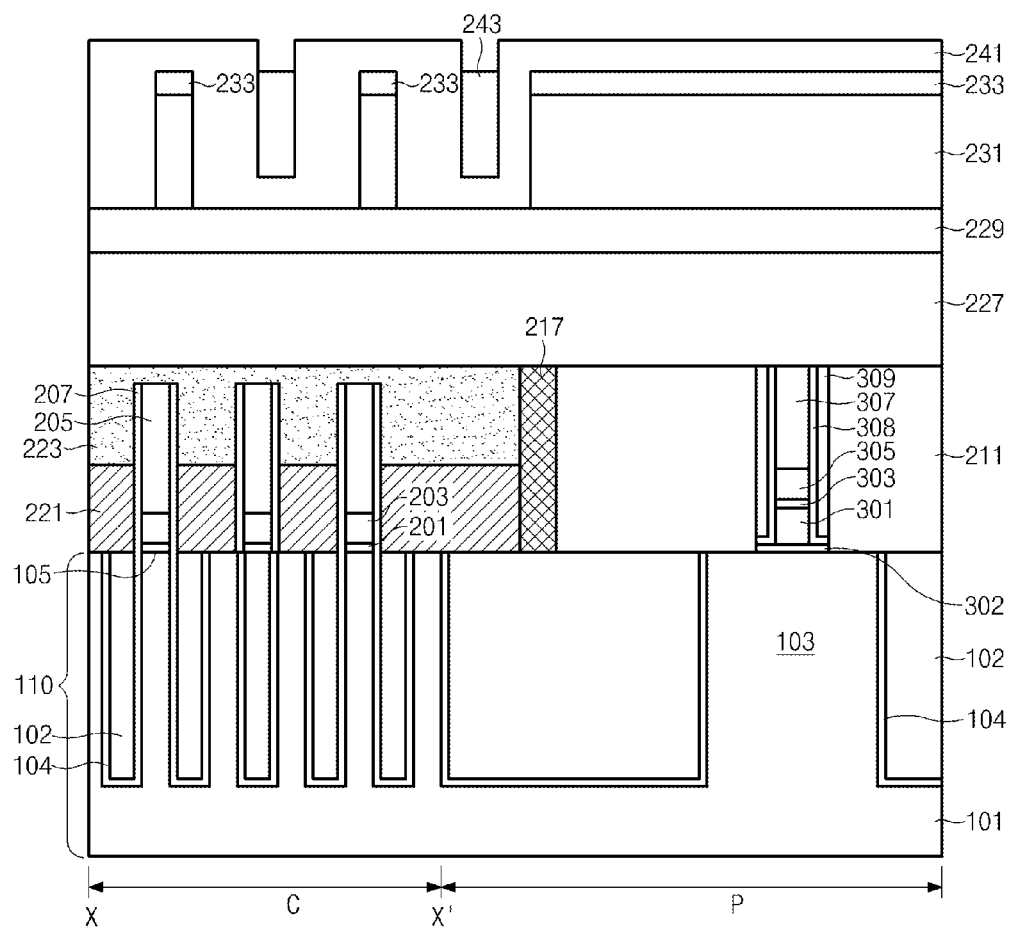

Referring to FIG. 3I, a spacer material 241 is deposited conformally over the first patterns 239. The spacer material 241 has good step coverage to form holes 242 between the first patterns 239 and between the first pattern 239 and the second interlayer insulation film 231. Referring to FIG. 3J, a spin on carbon (SOC) material 243 is buried in the holes 242. In an embodiment, the SOC material 243 partially fills the holes 242 so that a top surface of the SOC material 243 is at substantially the same level as a top surface of the first pattern 239.

Figure 3K:
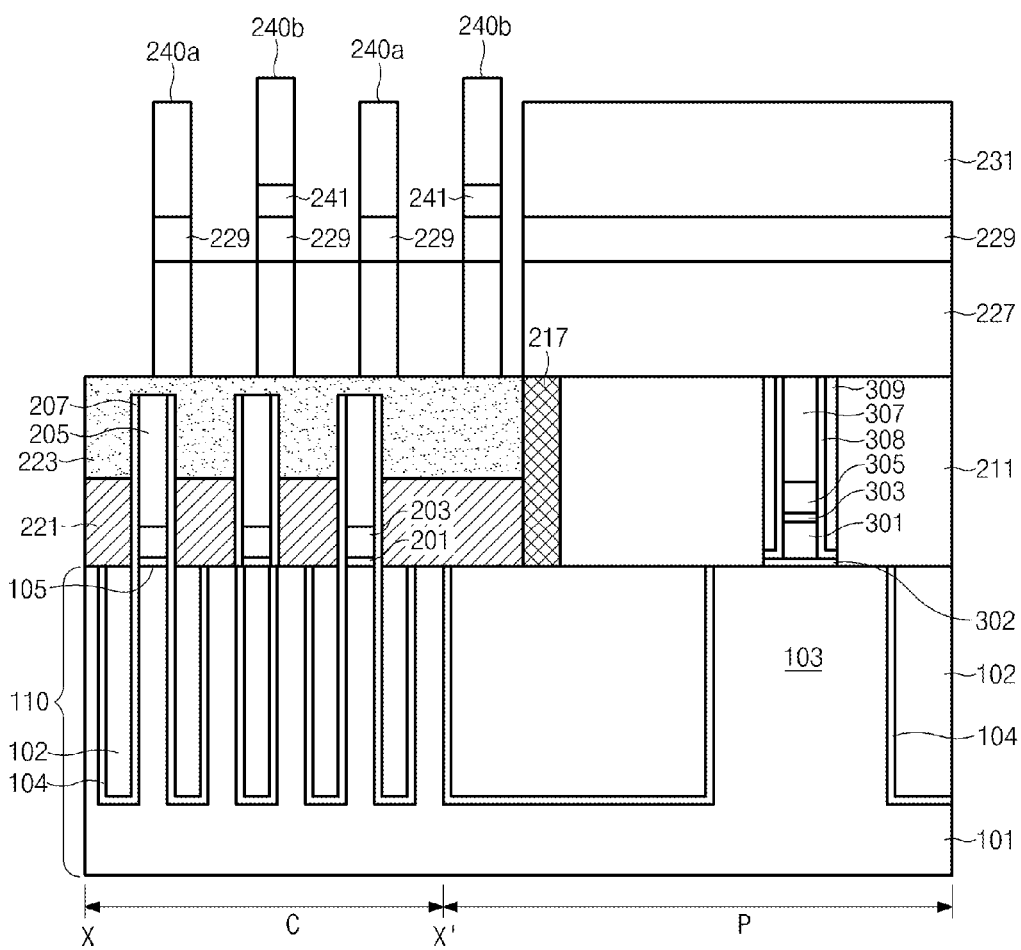

Thereafter, as shown in FIG. 3K, second patterns 240a and 240b are formed by etching the spacer material 241 and the first etch stop film 229. During this etch process, the second etch stop film 233 remaining at a top part of the first patterns 239 is also removed. The second pattern 240a is formed from the first pattern 239 of FIG. 3I, and the second pattern 240b is formed from the SOC material 243. The second patterns 240a and 240b may be formed to have substantially the same width as the first pattern 239.

A distance between the first patterns 239 is at least two times greater than a distance between the second patterns 240a and 240b.

In an embodiment, when the spacer material 241 and the first etch stop film 229 are removed, the spacer material 241 and the second etch stop film 233 that are formed in the peripheral region P are also removed.

Figure 3L:
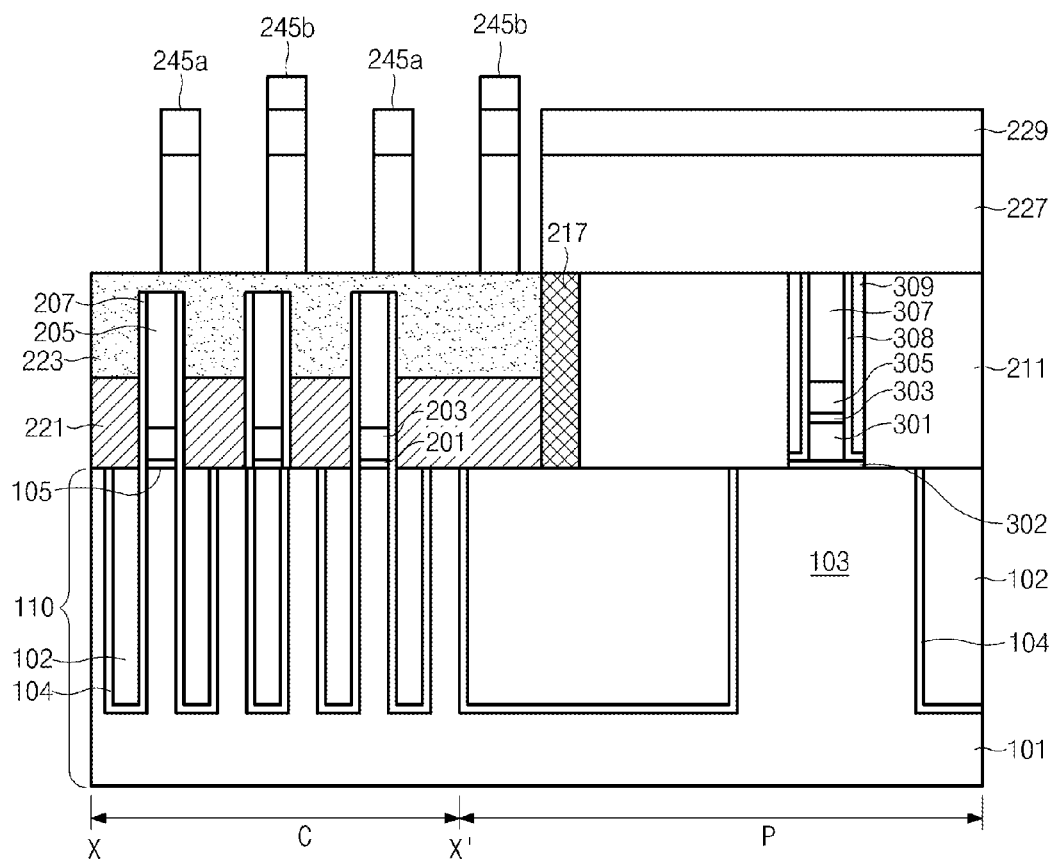

Referring to FIG. 3L, third patterns 245a and 245b are formed by etching the first interlayer insulation film 227 using the second patterns 240a and 240b as a mask. During this etching process, the second interlayer insulation film 231 formed at a top part of the third pattern 245a and the SOC material 243 formed at a top part of the third pattern 245b are simultaneously removed. The third patterns 245a and 245b may have substantially the same width as the first pattern 239.

When the third patterns 245a and 245b are formed, the second interlayer insulation film 231 that is formed in the peripheral region P is also removed.

Figure 3M:
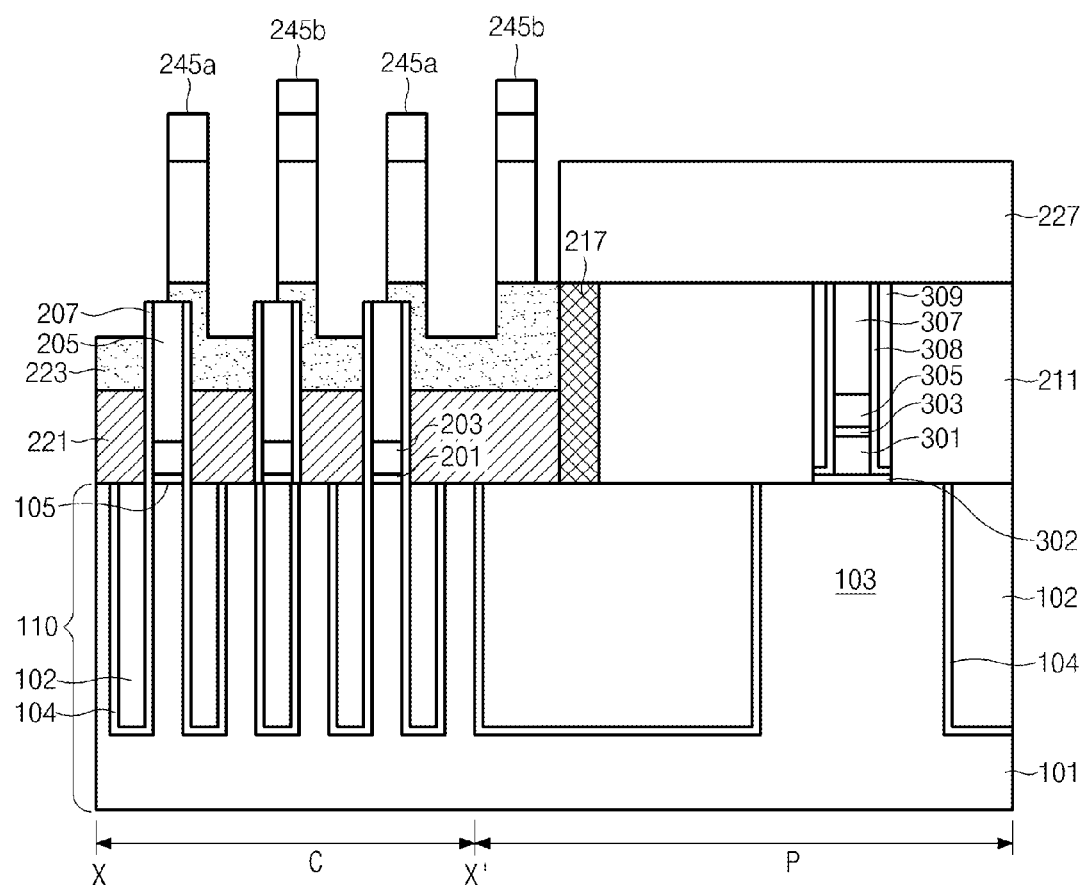

Referring to FIG. 3M, the second storage node contact 223 formed as a line type is etched using the third patterns 245a and 245b as a mask. When the second storage node contact 223 is etched, the first etch stop film 229 that is formed in the peripheral region P is also removed.

After that, the third patterns 245a and 245b and the first interlayer insulation film 227 formed in the peripheral region P are removed.

In FIGS. 3Na-3Nc, FIG. 3Na is a perspective view of the semiconductor device, FIG. 3Nb is a cross-sectional view of the semiconductor device taken along a line X-X' in FIG. 3Na, and FIG. 3Nc is a cross-sectional view of the semiconductor device taken along a line Y-Y' in FIG. 3Na. Referring to FIGS. 3Na-3Nc, the second storage node contact 223 includes a first top surface 247 and a second top surface 249 that are formed to have a step difference therebetween. The first top surface 247 is located at a higher level than a top surface 255 of the bit line 210, and the second top surface 249 is located at a lower level than the top surface 255 of the bit line 210. The supporting film 217 includes a first top surface 251 and a second stop surface 253 that are formed to have a step difference therebetween, the first top surface 251 may be formed over the bit line 210, and the second top surface 253 may be formed at substantially the same level as the top surface 255 of the bit line 210, or may be formed at a level lower than the top surface 255 of the bit line 210.

FIG. 4 is a block diagram illustrating an electronic device including a semiconductor device according to an embodiment.

Referring to FIG. 4, the electronic device 800 includes a data storage unit 810, a memory controller 820, a buffer (cache) memory 830, and an input/output (I/O) interface 840.

The data storage unit 810 may store data received from the memory controller 820 and output the stored data to the memory controller 820 in response to a control signal from the memory controller 820. The data storage unit 810 may include various non-volatile memory units that can get back stored data even when powered off, for example, a NOR flash memory, a NAND flash memory, a phase change random access memory (PRAM), a resistive random access memory (RRAM), a spin transfer torque random access memory (STTRAM), a magnetic random access memory (MRAM), etc.

The memory controller 820 may decode a command received from an external device (e.g., host device) through the I/O interface 840, and may control data I/O operations of the data storage unit 810 and the buffer memory 830. Although the memory controller 820 is denoted by a single block in FIG. 4 for illustrative convenience, the memory controller 820 may include a first controller for controlling the data storage unit 810 and a second controller for controlling the buffer memory 830. Here, the first controller and the second controller may be arranged independently from each other.

The buffer memory 830 may temporarily store data to be processed by the memory controller 820. In other words, the buffer memory 830 may temporarily store data to be input to the data storage unit 810 and data output from the data storage unit 810. The buffer memory 830 may store data received from the memory controller 830 and output the stored data to the memory controller 820 in response to a control signal from the memory controller 820. The buffer memory 830 may include a volatile memory such as a dynamic random access memory (DRAM), a mobile DRAM, a static random access memory (SRAM), or the like.

The I/O interface 840 may provide a physical connection between the memory controller 820 and the external device (host device) such that the memory controller 820 receives data I/O control signals from the external device and exchanges data with the external device. The I/O interface 840 may include at least one of interface protocols, for example, a universal serial bus (USB) protocol, a multimedia card (MMC) protocol, a peripheral component interconnection (PCI) protocol, a PCI-express (PCI-E) protocol, a serial attached SCSI (SAS), a serial ATA (SATA) protocol, a parallel advanced technology attachment (PATA) protocol, a small computer small interface (SCSI) protocol, an enhanced small disk interface (ESDI) protocol, and an integrated drive electronics (IDE) protocol.

Each of memory cells of the data storage unit 810 or the buffer memory 830 in the electronic device 800 may include a supporting film formed to be perpendicular to a bit line, a first storage node contact formed at a lower part of a region between the bit line and the supporting film, and a second storage node contact that is formed in a line shape isolated by the supporting film, formed over the first storage node contact and the bit line, and patterned in a diagonal direction. As a result, a process margin between a storage node and the storage node contact is improved, and a fabrication process is simplified. Self-alignment of the storage node contact is also facilitated.

The electronic device 800 shown in FIG. 4 may be used as an auxiliary memory device or an external storage device of the host device. The electronic device 800 may include any of a solid state disc (SSD), a universal serial bus (USB) memory, a secure digital (SD) card, a mini secure digital (mSD) card, a micro SD card, a high-capacity secure digital high capacity (SDHC) card, a memory stick card (MSC), a smart media (SM) card, a multi media card (MMC), an embedded MMC (eMMC), a compact flash (CF) card, etc.

As is apparent from the above description, a semiconductor device and a method for forming the same according to embodiments can simplify a storage node contact forming process and facilitate self-alignment of the storage node contact.

Those skilled in the art will appreciate that embodiments may be carried out in other specific ways than those set forth herein without departing from the spirit and essential characteristics of the present invention. The above embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an exemplary embodiment or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device, the method comprising:
    forming first and second bit lines spaced apart from each other by a first distance over a semiconductor substrate;
    forming first and second supporting films spaced apart from each other by a second distance in a direction perpendicular to the first and second bit lines;
    forming a first storage node contact and a second storage node contact between the first supporting film and the second supporting film, after forming the first and second supporting films, so that the first and second storage node contacts are supported by the first and second supporting films; and
    etching upper portions of the second storage node contact and the first and second supporting films in a diagonal direction across the first and second bit lines at the same time.

2. The method according to claim 1, wherein forming the first and second supporting films includes:
    forming an interlayer insulation film to fill a space between the first bit line and the second bit line;
    forming a capping film over the first and second bit lines and the interlayer insulation film;
    forming first and second holes spaced apart from each other by the second distance in a direction perpendicular to the first and second bit lines;
    forming the first supporting film and the second supporting film by filling the first hole and the second hole with an insulation material; and
    removing the interlayer insulation film and the capping film.

3. The method according to claim 2, wherein, in the forming of the first and second supporting film, the first hole and the second hole are formed in a cell region using a cell-opening mask.

4. The method according to claim 1, wherein forming the first and second storage node contacts includes:
    forming the first storage node contact at a lower part of a region surrounded by the first and second supporting films and the first and second bit lines; and
    forming the second storage node contact over the first storage node contact and the first and second bit lines.

5. The method according to claim 4, wherein a top surface of the second storage node contact is located at substantially the same level as the top surfaces of the first and second supporting films or located below the top surfaces of the first and second supporting films.

6. The method according to claim 1, wherein the first storage node contact is formed of a polysilicon material, and the second storage node contact is formed of a metal material.

7. The method according to claim 1, wherein the patterning includes:
    patterning the second storage node using a Spacer Patterning Technology (SPT) or a Double Patterning Technology (DPT).

8. The method according to claim 1, wherein the patterning includes:
    sequentially depositing a first interlayer insulation film, a first etch stop film, a second interlayer insulation film, and a second etch stop film over the second storage node contact and the first and second supporting films;
    forming first patterns by etching the second etch stop film and the second interlayer insulation film;
    depositing a spacer material along a step difference of the first patterns;
    depositing a Spin On Carbon (SOC) material in a space disposed between the first patterns on which the spacer material is deposited;
    forming second patterns by etching the spacer material and the first etch stop film;

forming third patterns by etching the first interlayer insulation film using the second patterns as a mask; and patterning the upper portions of the second storage node contact and the first and second supporting films using the third patterns as a mask.

9. The method according to claim 8, wherein a distance between the first patterns is at least two times greater than a distance between the second patterns.

* * * * *